United States Patent
Chang et al.

(10) Patent No.: US 11,367,725 B2
(45) Date of Patent: Jun. 21, 2022

(54) BURIED WORD LINE OF A DYNAMIC RANDOM ACCESS MEMORY AND METHOD FOR FABRICATING THE SAME

(71) Applicants: UNITED MICROELECTRONICS CORP., Hsin-Chu (TW); Fujian Jinhua Integrated Circuit Co., Ltd., Quanzhou (CN)

(72) Inventors: Feng-Yi Chang, Tainan (TW); Chun-Hsien Lin, Tainan (TW); Fu-Che Lee, Taichung (TW)

(73) Assignees: UNITED MICROELECTRONICS CORP., Hsin-Chu (TW); Fujian Jinhua Integrated Circuit Co., Ltd., Quanzhou (CN)

( * ) Notice: Subject to any disclaimer, the term of this patent is extended or adjusted under 35 U.S.C. 154(b) by 0 days.

(21) Appl. No.: 17/079,537

(22) Filed: Oct. 26, 2020

(65) Prior Publication Data

US 2021/0043632 A1    Feb. 11, 2021

Related U.S. Application Data

(62) Division of application No. 16/406,017, filed on May 8, 2019, now Pat. No. 10,854,613, which is a division
(Continued)

(30) Foreign Application Priority Data

Nov. 17, 2017  (CN) .......................... 201711146632.9

(51) Int. Cl.
*H01L 27/108* (2006.01)
*H01L 29/423* (2006.01)
(Continued)

(52) U.S. Cl.
CPC .. *H01L 27/10823* (2013.01); *H01L 27/10876* (2013.01); *H01L 29/4991* (2013.01);
(Continued)

(58) Field of Classification Search
CPC .......... H01L 27/10823; H01L 29/4991; H01L 27/10876; H01L 21/316; H01L 27/10891; H01L 29/4236
(Continued)

(56) References Cited

U.S. PATENT DOCUMENTS

| 8,153,489 B2 | 4/2012 | Song |
| 8,154,088 B1 | 4/2012 | Khoueir et al. |

(Continued)

FOREIGN PATENT DOCUMENTS

| CN | 1841672 A | 10/2006 |
| CN | 102214578 A | 10/2011 |

(Continued)

*Primary Examiner* — Thinh T Nguyen
(74) *Attorney, Agent, or Firm* — Winston Hsu

(57) ABSTRACT

A method for fabricating a buried word line (BWL) of a dynamic random access memory (DRAM) includes the steps of: forming a first doped region in a substrate; removing part of the first doped region to form a trench in the substrate;
(Continued)

forming a gate structure in the trench; and forming a barrier structure between the gate structure and the first doped region.

10 Claims, 7 Drawing Sheets

Related U.S. Application Data of application No. 15/841,257, filed on Dec. 13, 2017, now Pat. No. 10,332,887.

(51) Int. Cl.
    *H01L 21/02*     (2006.01)
    *H01L 29/49*     (2006.01)
    *H01L 29/51*     (2006.01)
    *H01L 29/06*     (2006.01)

(52) U.S. Cl.
    CPC .... *H01L 21/0214* (2013.01); *H01L 27/10891* (2013.01); *H01L 29/0657* (2013.01); *H01L 29/4236* (2013.01); *H01L 29/518* (2013.01)

(58) Field of Classification Search
    USPC ........ 438/238, 239, 386, 389; 257/238, 239, 257/386, 389, 296
    See application file for complete search history.

(56) References Cited

U.S. PATENT DOCUMENTS

| | | | |
|---|---|---|---|
| 8,168,521 | B2 | 5/2012 | Jeon |
| 8,546,858 | B2 | 10/2013 | Jang |
| 8,835,275 | B2 | 9/2014 | Park |
| 8,896,059 | B1 | 11/2014 | Kim |
| 2010/0213541 | A1 | 8/2010 | Jeon |
| 2010/0240180 | A1* | 9/2010 | Jeon et al. ...... H01L 21/823437 438/239 |
| 2010/0248437 | A1* | 9/2010 | Kim et al. .......... H01L 29/4933 438/270 |
| 2012/0261739 | A1 | 10/2012 | Yang |
| 2013/0119448 | A1 | 5/2013 | Lee |
| 2013/0171801 | A1 | 7/2013 | Park |
| 2014/0117459 | A1 | 5/2014 | Kim |
| 2014/0231892 | A1 | 8/2014 | Song |
| 2015/0001602 | A1 | 1/2015 | Wu |
| 2016/0172488 | A1 | 6/2016 | Oh |

FOREIGN PATENT DOCUMENTS

| | | |
|---|---|---|
| CN | 103681804 A | 3/2014 |
| CN | 104347379 A | 2/2015 |
| TW | 201320307 A1 | 5/2013 |

* cited by examiner

BURIED WORD LINE OF A DYNAMIC RANDOM ACCESS MEMORY AND METHOD FOR FABRICATING THE SAME

CROSS REFERENCE TO RELATED APPLICATIONS

This application is a division of U.S. application Ser. No. 16/406,017 filed May 8, 2019, which is a division of U.S. application Ser. No. 15/841,257 filed Dec. 13, 2017, all of which are hereby incorporated by reference in their entirety

BACKGROUND OF THE INVENTION

1. Field of the Invention

The invention relates to a method for fabricating semiconductor device, and more particularly to a method for fabricating buried word line (BWL) of a dynamic random access memory (DRAM) device.

2. Description of the Prior Art

As electronic products develop toward the direction of miniaturization, the design of dynamic random access memory (DRAM) units also moves toward the direction of higher integration and higher density. Since the nature of a DRAM unit with buried gate structures has the advantage of possessing longer carrier channel length within a semiconductor substrate thereby reducing capacitor leakage, it has been gradually used to replace conventional DRAM unit with planar gate structures.

Typically, a DRAM unit with buried gate structure includes a transistor device and a charge storage element to receive electrical signals from bit lines and word lines. Nevertheless, current DRAM units with buried gate structures still pose numerous problems due to limited fabrication capability. Hence, how to effectively improve the performance and reliability of current DRAM device has become an important task in this field.

SUMMARY OF THE INVENTION

According to an embodiment of the present invention, a method for fabricating a buried word line (BWL) of a dynamic random access memory (DRAM) includes the steps of: forming a first doped region in a substrate; removing part of the first doped region to form a trench in the substrate; forming a gate structure in the trench; and forming a barrier structure between the gate structure and the first doped region.

According to another aspect of the present invention, a buried word line (BWL) of a dynamic random access memory (DRAM) includes: a trench in a substrate; a doped region adjacent to two sides of the trench; a gate structure in the trench; and a barrier structure between the gate structure and the doped region. Preferably, the gate structure includes a conductive layer in the trench and a gate dielectric layer between the conductive layer and the substrate, and the barrier structure and the gate dielectric layer comprise different depths.

According to yet another aspect of the present invention, a buried word line (BWL) of a dynamic random access memory (DRAM) includes: a trench in a substrate; a first doped region adjacent to two sides of the trench; a gate structure in the trench; and a barrier structure in the substrate adjacent to two sides of the trench. Preferably, the gate structure includes: a conductive layer in the trench and a gate dielectric layer between the conductive layer and the substrate, and the barrier structure overlaps the first doped region and the substrate.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
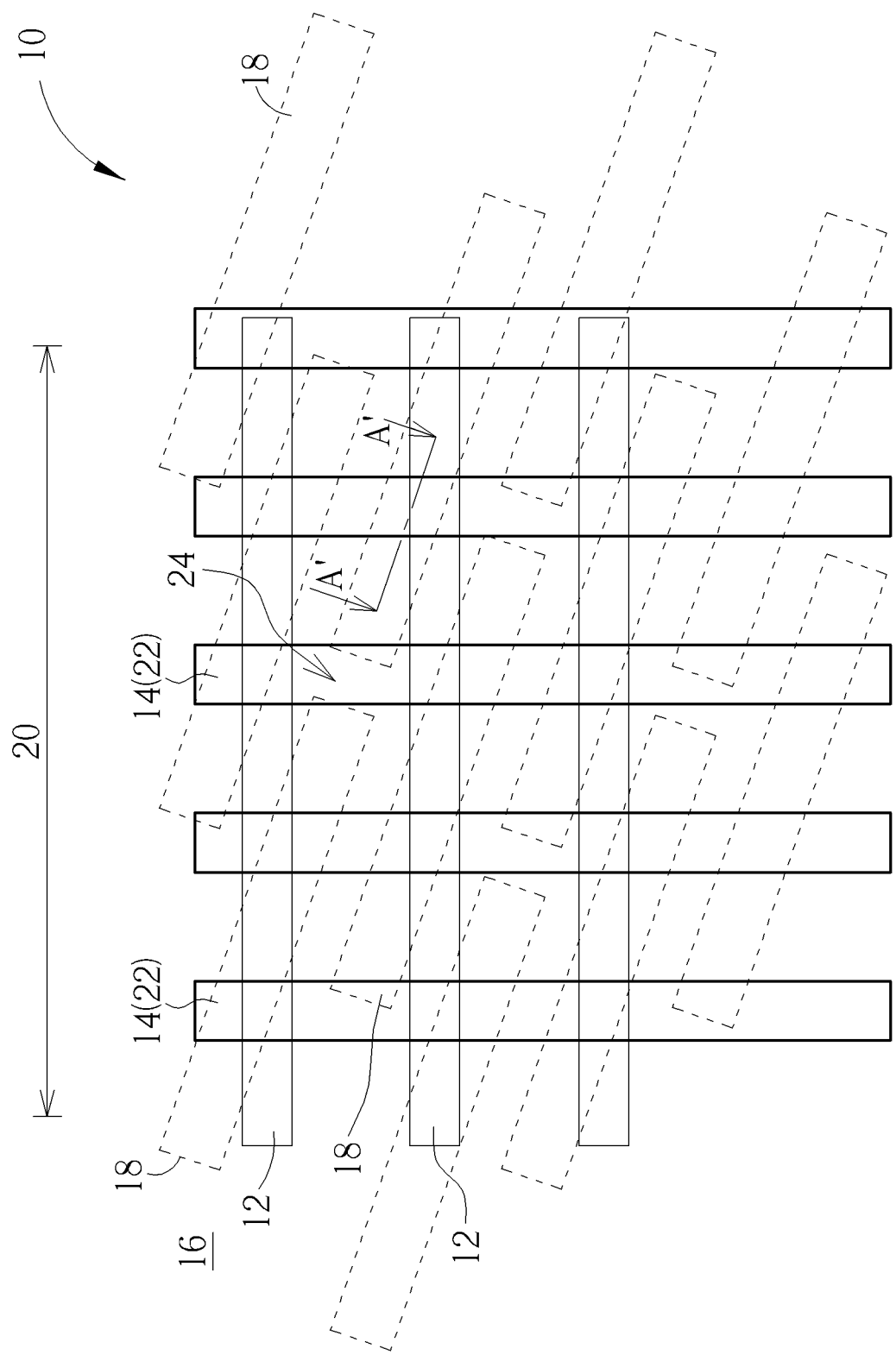
FIG. 1 illustrates a top view of a DRAM device according to an embodiment of the present invention.

Referring to FIGS. 1-7, FIGS. 1-7 illustrate a method for fabricating a DRAM device according to an embodiment of the present invention, in which FIG. 1 illustrates a top-view diagram of a DRAM device and FIGS. 2-7 illustrate cross-sectional views for fabricating a buried word line of a DRAM device along the sectional line AA' in FIG. 1. Preferably, the present embodiment pertains to fabricate a memory device, and more particularly a DRAM device 10, in which the DRAM device 10 includes at least a transistor device (not shown) and at least a capacitor structure (not shown) that will be serving as a smallest constituent unit within the DRAM array and also used to receive electrical signals from bit lines 12 and word lines 14.

As shown in FIG. 1, the DRAM device 10 includes a substrate 16 such as a semiconductor substrate or wafer made of silicon, a shallow trench isolation (STI) 24 formed in the substrate 16, and a plurality of active areas (AA) 18 defined on the substrate 16. A memory region 20 and a periphery region (not shown) are also defined on the substrate 16, in which multiple word lines 14 and multiple bit lines 12 are preferably formed on the memory region 20 while other active devices (not shown) could be formed on the periphery region. For simplicity purpose, only devices or elements on the memory region 20 are shown in FIG. 1 while elements on the periphery region are omitted.

In this embodiment, the active regions 18 are disposed parallel to each other and extending along a first direction, the word lines 14 or multiple gates 22 are disposed within the substrate 16 and passing through the active regions 18 and STI 24. Preferably, the gates 22 are disposed extending along a second direction, in which the second direction crosses the first direction at an angle less than 90 degrees.

The bit lines 12 on the other hand are disposed on the substrate 16 parallel to each other and extending along a third direction while crossing the active regions 18 and STI 24, in which the third direction is different from the first direction and orthogonal to the second direction. In other words, the first direction, second direction, and third direction are all different from each other while the first direction is not orthogonal to both the second direction and the third direction. Preferably, contact plugs such as bit line contacts (BLC) (not shown) are formed in the active regions 18 adjacent to two sides of the word lines 14 to electrically connect to source/drain region (not shown) of each transistor element and storage node contacts (not shown) are formed to electrically connect to a capacitor.

Figure 2:
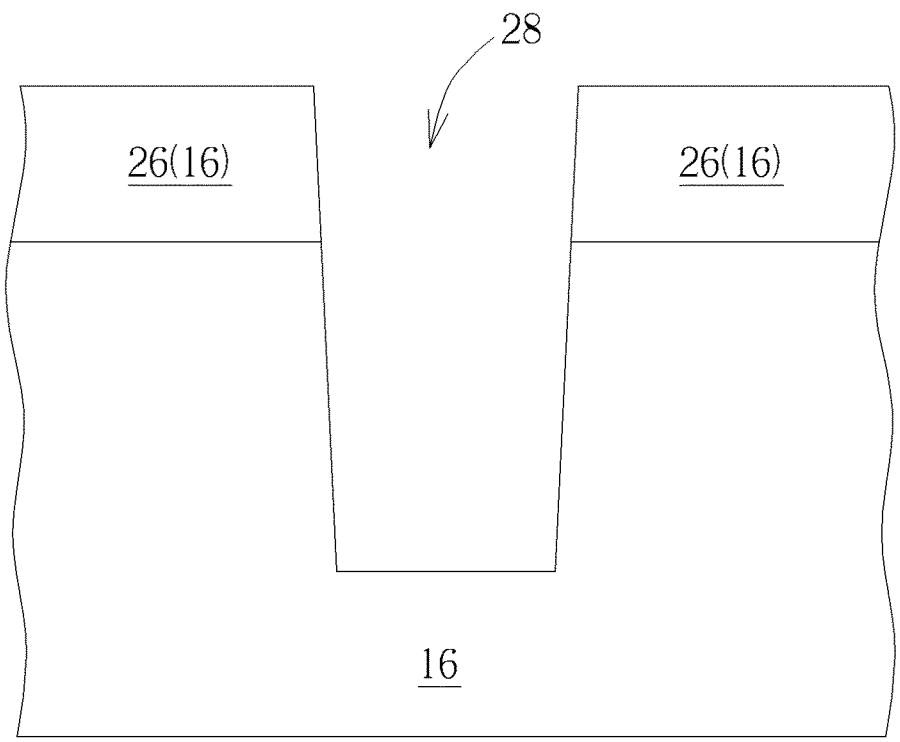
FIGS. 2-7 illustrate cross-sectional views for fabricating a buried word line of a DRAM device along the sectional line AA' in FIG. 1.

The fabrication of word lines 14 (or also referred to as buried word lines) is explained below. As shown in FIG. 2, an ion implantation process is conducted by implanting dopants such as n-type dopants into the substrate 16 to form a doped region 26 or a lightly doped drain (LDD) and a trench 28 is formed in the substrate 16 thereafter. In this embodiment, the formation of the trench 28 could be accomplished by first forming a patterned mask (not shown), such as a patterned resist on the surface of the substrate 16 or doped region 26, and then conducting an etching process by using the patterned mask as mask to remove part of the doped region 26 and part of the substrate 16 under the doped region 26 to form a trench 28.

Figure 3:
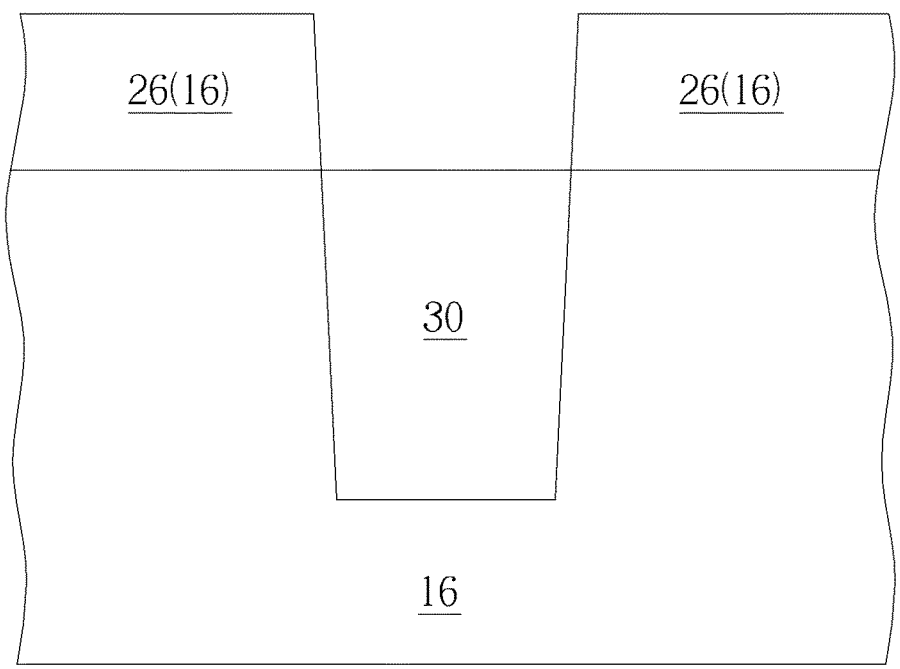

Next, as shown in FIG. 3, an organic layer 30 is formed into the trench 28 to fill the trench 28 completely and at the same time covering the surface of the substrate 16 or doped region 26. In this embodiment, the organic layer 30 preferably includes a resist material, but not limited thereto. Next, an etching process is conducted to remove part of the organic layer 30 so that the top surface of the remaining organic layer 30 is substantially even with the bottom surface of the doped region 26. In this embodiment, the etching process conducted to remove part of the organic layer 30 could include a dry etching process, in which the dry etching process could further include two stages for removing part of the organic layer 30 on the surface of the substrate 30 and then adjusting the height of the remaining organic layer 30. Preferably, the etching gas used in the two stages of dry etching process could be the same or different and the etching gas from both stages could include oxygen, nitrogen, or combination thereof. Nevertheless, according to other embodiments of the present invention, the etching gases from both stages of the dry etching process could also be selected from the group consisting of ammonia gas ($NH_3$), carbon monoxide (CO), carbon dioxide ($CO_2$), sulfur dioxide ($SO_2$), and carbonyl sulfide (COS).

Figure 4:
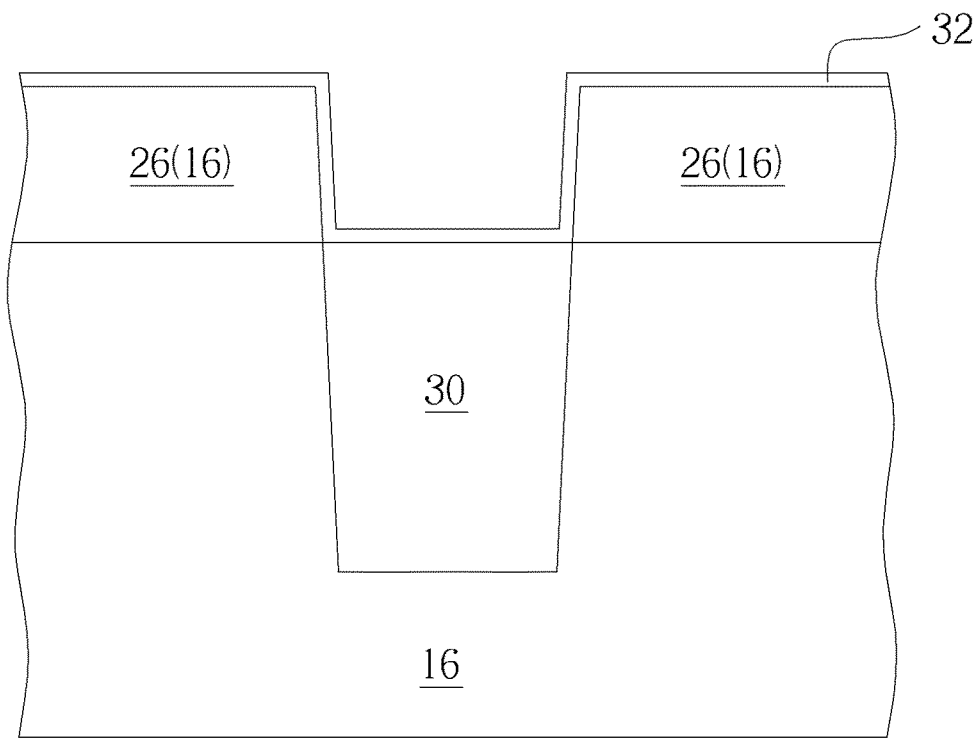

Next, as shown in FIG. 4, a low temperature atomic layer deposition process is conducted to form a first gate dielectric layer 32 in the trench 28 and on the organic layer 30. Specifically, the first gate dielectric layer 32 is deposited on sidewalls of the trench 28 above the organic layer 30, the top surface of the doped region 26, and the top surface of the organic layer 30.

In this embodiment, the first gate dielectric layer 32 preferably includes silicon oxide. Nevertheless, according to other embodiments of the present invention, the first gate dielectric layer 32 could also include a high-k dielectric layer depending on the demand of the product, in which the high-k dielectric layer is preferably selected from dielectric materials having dielectric constant (k value) larger than 4. For instance, the high-k dielectric layer may be selected from hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), strontium bismuth tantalate ($SrBi_2Ta_2O_9$, SBT), lead zirconate titanate ($PbZr_xTi_{1-x}O_3$, PZT), barium strontium titanate ($Ba_xSr_{1-x}TiO_3$, BST) or a combination thereof.

Figure 5:
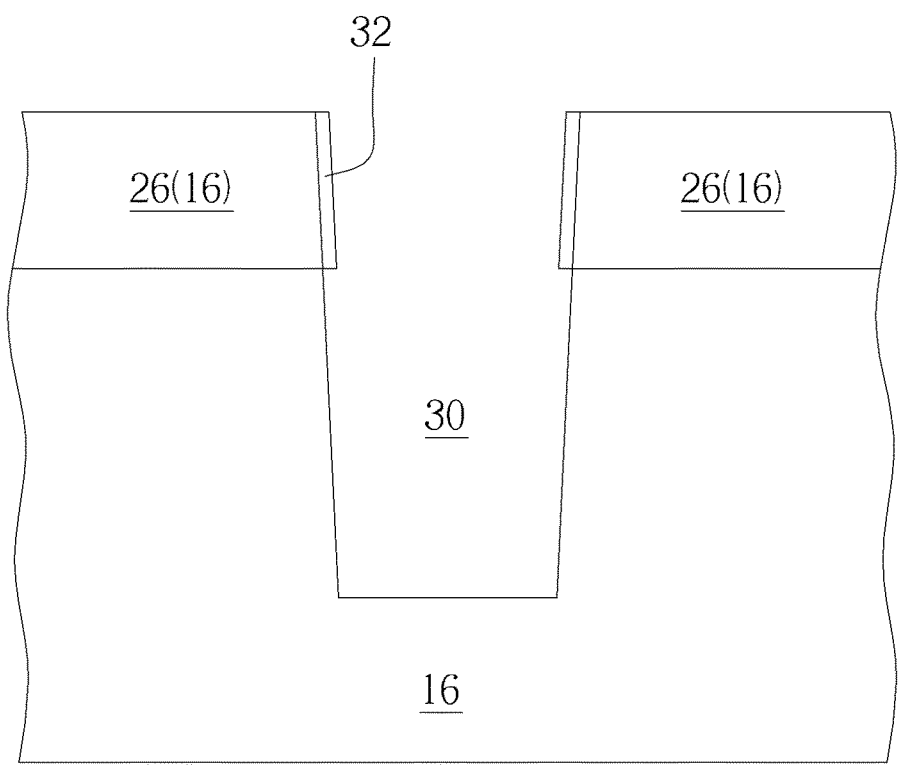

Next, as shown in FIG. 5, an etching process is conducted to remove the first gate dielectric layer 32 on the top surface of the doped region 26 and the top surface of the organic layer 30 so that the remaining first gate dielectric layer 32 only covers the sidewalls of the doped region 26 or sidewalls of the trench 28 directly above the organic layer 30. Next, another etching process is conducted to remove the remaining organic layer 30 completely. In this embodiment, the etching process conducted to remove the organic layer 30 preferably includes a wet etching process, in which the wet etching process is conducted under an environment between 98° C. to 120° C. by using etchant including but not limited to for example sulfuric acid-hydrogen peroxide mixture (SPM) to remove the organic layer 30 and expose sidewalls and bottom of the trench 28 below the doped region 26 without damaging any of the first gate dielectric layer 32.

Figure 6:
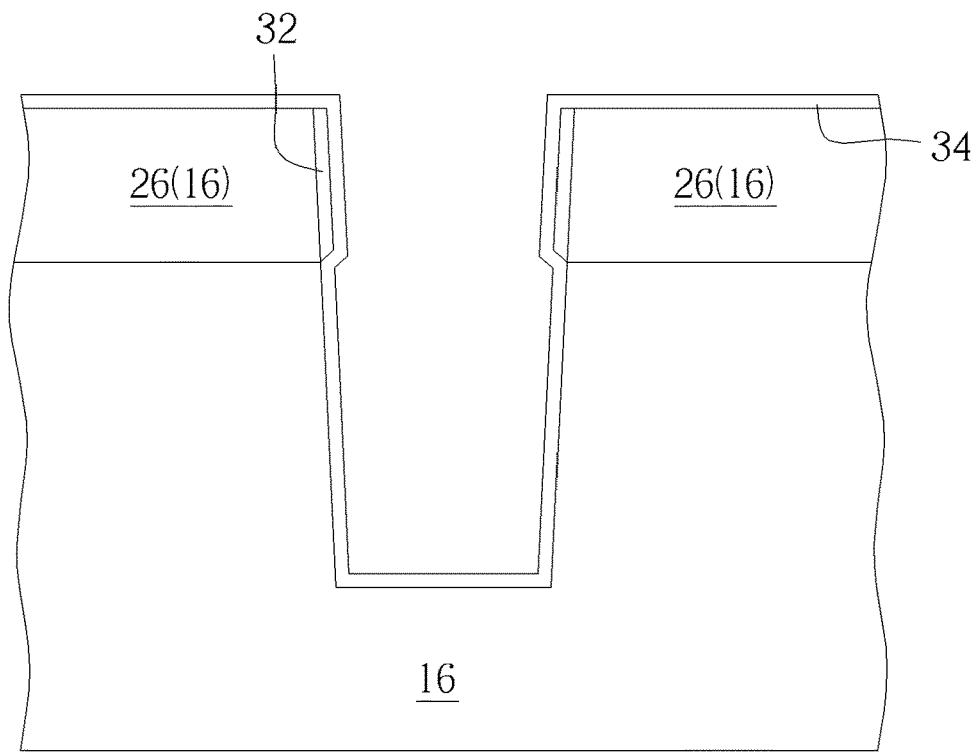

Next, as shown in FIG. 6, a second gate dielectric layer 34 is formed on the first gate dielectric layer 32 and in the trench 28, in which the second gate dielectric layer 34 conformally covers the top surface of the doped region 26, the top and bottom surfaces and sidewalls of the first gate dielectric layer 32, and sidewalls of the trench 28 below the doped region 26.

In this embodiment, the first gate dielectric layer 32 and the second gate dielectric layer 34 are preferably made of same material such as silicon oxide. Nevertheless, according to other embodiments of the present invention, the second gate dielectric layer 34 could also include a high-k dielectric layer having dielectric constant larger than 4 depending on the demand of the product and the material of the high-k dielectric layer could be selected from hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), strontium bismuth tantalate ($SrBi_2Ta_2O_9$, SBT), lead zirconate titanate ($PbZr_xTi_{1-x}O_3$, PZT), barium strontium titanate ($Ba_xSr_{1-x}TiO_3$, BST) or a combination thereof.

In this embodiment, the thickness of the second gate dielectric layer 34 is preferably slightly greater than or equal to the thickness of the first gate dielectric layer 32, in which the thickness of the second gate dielectric layer 34 is between 30 Angstroms to 60 Angstroms and the thickness of the first gate dielectric layer 32 is between 20 Angstroms to 60 Angstroms.

Figure 7:
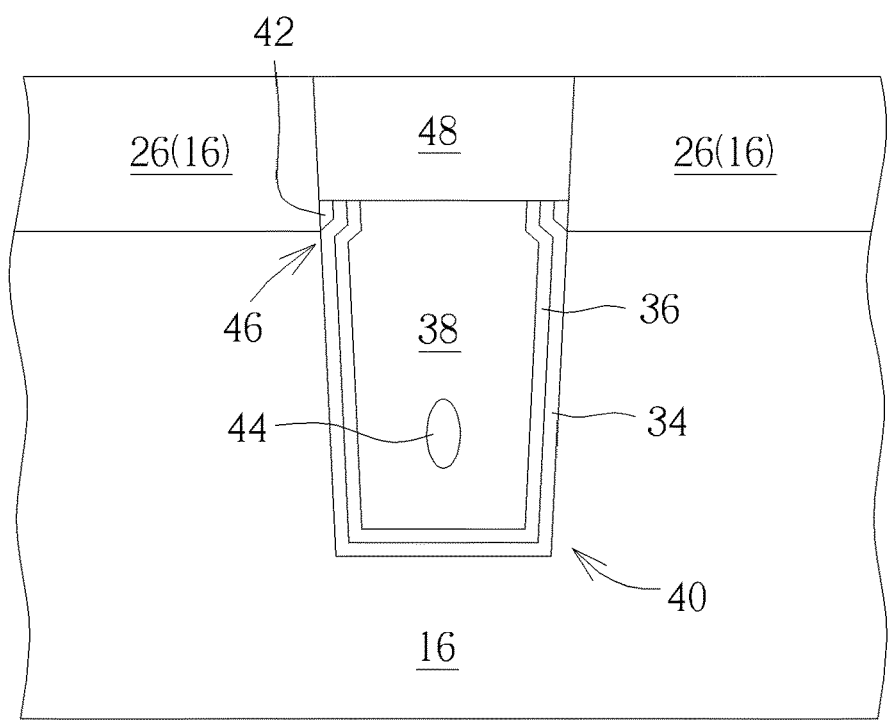

Next, as shown in FIG. 7, a barrier layer 36 and a conductive layer 38 are sequentially formed on the second gate dielectric layer 34, in which the barrier layer 36 is formed on the surface of the second gate dielectric layer 34 and the conducted layer 38 is formed on the barrier layer 36 while filling the trench 28 completely. Next, an etching back process is conducted to remove part of the conductive layer 38, part of the barrier layer 36, part of the second gate dielectric layer 34, and part of the first gate dielectric layer 32 to form a gate structure 40 in the trench, a shielding or barrier structure 42 made of remaining first gate dielectric layer 32 between the gate structure 40 and the doped region 26, and an air gap 44 enclosed within the conductive layer 38 at the same time, in which the gate structure 40 preferably being one of the word lines 14 shown in FIG. 1.

In this embodiment, the barrier layer 36 preferably includes TiN, but not limited thereto. Specifically, the barrier layer 36 preferably includes a work function metal layer which could be a n-type work function metal layer or p-type work function metal layer depending on the demand of the process or product. In this embodiment, n-type work function metal layer could include work function metal layer having a work function ranging between 3.9 eV and 4.3 eV such as but not limited to for example titanium aluminide (TiAl), zirconium aluminide (ZrAl), tungsten aluminide (WAl), tantalum aluminide (TaAl), hafnium aluminide (HfAl), or titanium aluminum carbide (TiAlC), but it is not limited thereto. P-type work function metal layer on the other hand could include work function metal layer having a work function ranging between 4.8 eV and 5.2 eV such as but not limited to for example titanium nitride (TiN), tantalum nitride (TaN), or tantalum carbide (TaC), but not limited thereto.

Viewing from a structural perspective, the top surface of the barrier structure 42 is even with the top surfaces of the second gate dielectric layer 34, the barrier layer 36, and the conductive layer 38 and the top surfaces of all these four elements are slightly higher than the bottom surface of the doped region 26. The bottom surface or bottommost point of the barrier structure 42 is also even with or not lower than the bottom surface of the doped region 26 while the portion of second gate dielectric layer 34 directly contacting the sidewall and bottom surface of the barrier structure 42 forms a step-shaped profile 46. The air gap 44 is enclosed within the conductive layer 38 below the doped region 26 while the top surface or topmost point of the air gap 44 is lower than the bottom surface of the doped region 26.

Next, a hard mask 48 is formed on the gate structure 40, in which a top surface of the hard mask 48 is even with the top surface of the doped region 26. In this embodiment, the hard mask 48 is preferably made of dielectric material including but not limited to for example silicon nitride. Next, a contact plug process could be conducted to form bit line contacts adjacent to two sides of the gate structure 40 electrically connecting the source/drain region and bit lines formed thereafter and storage node contacts electrically connecting the doped region 26 and capacitors fabricated in the later process. This completes the fabrication of a buried word line according to an embodiment of the present invention.

Figure 8:
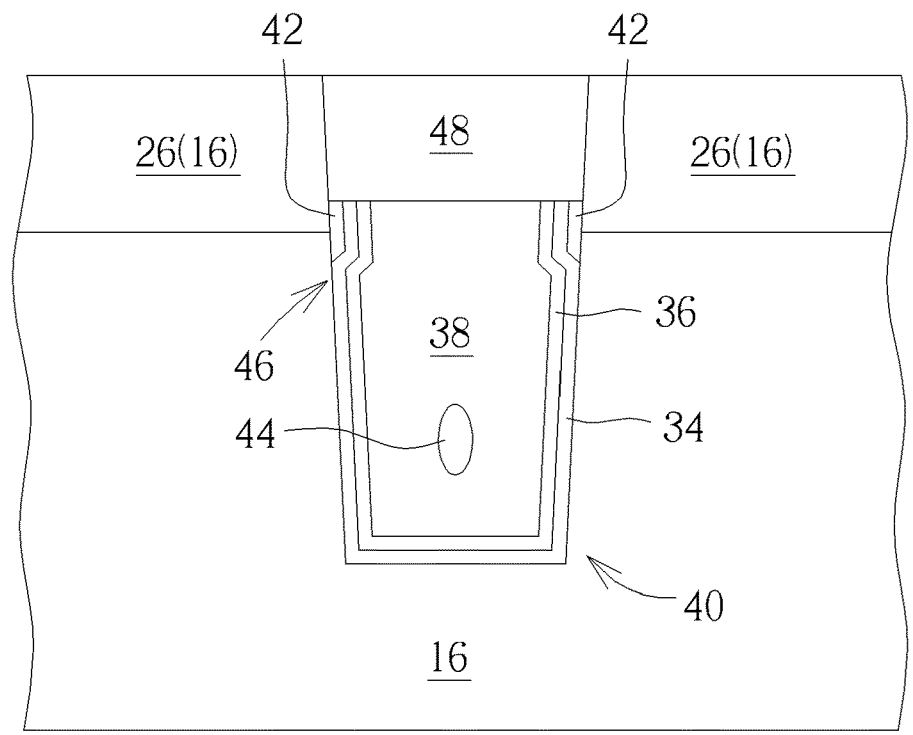
FIG. 8 illustrates a structural view of a buried word line of DRAM device according to an embodiment of the present invention.

Referring to FIG. 8, FIG. 8 illustrates a structural view of a buried word line of DRAM device according to an embodiment of the present invention. As shown in FIG. 8, it would be desirable to adjust or slightly lower the depth of the first gate dielectric layer 32 by adjusting the height of the organic layer 30 when part of the organic layer 30 is removed and first gate dielectric layer 32 is deposited on the organic layer 30 in FIGS. 2-4. For instance, it would be desirable to slightly lower the height of the organic layer 30 within the trench 28 so that the bottom surface of the first gate dielectric layer 32 formed on the organic layer 30 would be slightly lower than the bottom surface of the doped region 26. Next, processes from FIGS. 4-7 are conducted and the remaining first gate dielectric layer 32 would become the barrier structure 42 shown in FIG. 8, in which the top surface of the barrier structure 42 would be slightly higher than the bottom surface of the doped region 26 while the bottommost surface or point of the barrier structure 42 would be slightly lower than the bottom surface of the doped region 26.

Figure 9:
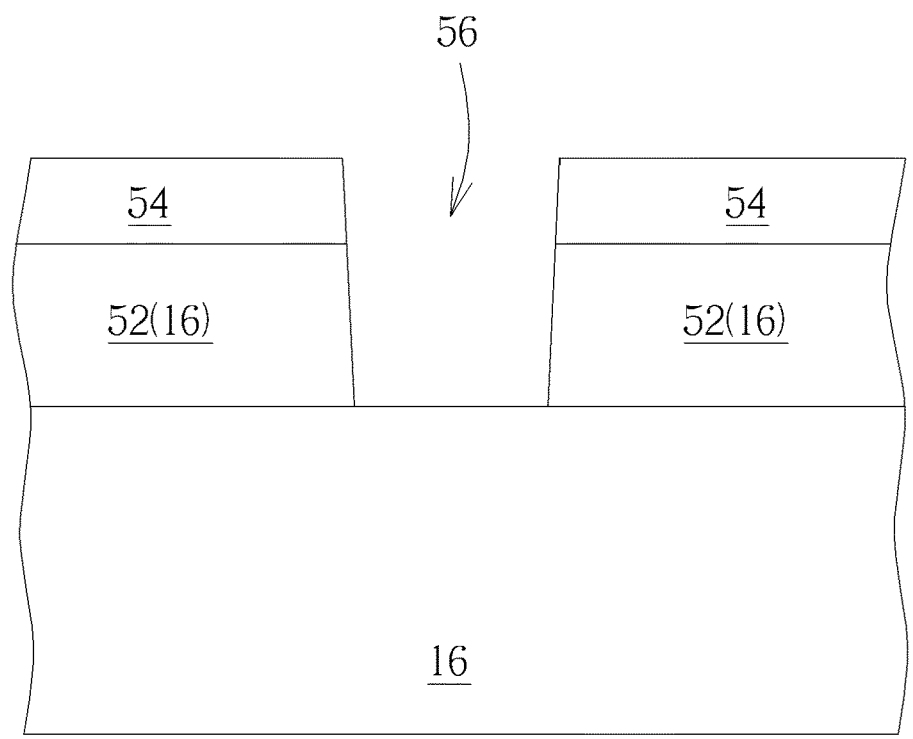
FIGS. 9-12 illustrate a method for fabricating a buried word line of a DRAM device according to an embodiment of the present invention.

Referring to FIGS. 9-12, FIGS. 9-12 illustrate a method for fabricating a buried word line of a DRAM device according to an embodiment of the present invention. As shown in FIG. 9, an ion implantation process is first conducted to implant dopants such as n-type dopants into the substrate 16 to form a doped region 52 or lightly doped drain, a patterned mask 54 is formed on the surface of the substrate 16, and part of the doped region 52 is removed by using the patterned mask 54 as mask to form at least a trench 56 in the substrate 16.

In contrast to the aforementioned embodiment of sequentially removing part of the substrate 16 containing dopants and part of the substrate 16 having no dopants, this embodiment only removes part of the doped region 52 or part of the substrate 16 containing dopants while none of the substrate 16 having no dopants is removed. In other words, the bottom of the trench 56 is preferably even with the bottom surface of the doped region 52.

Figure 10:
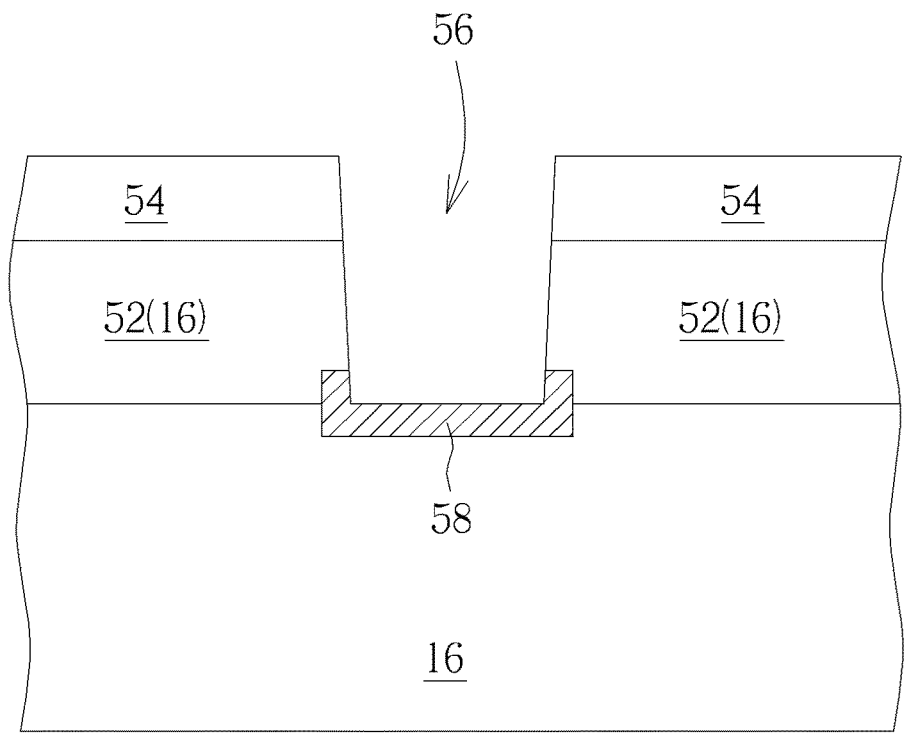

Next, as shown in FIG. 10, an ion implantation process is conducted to implant dopants into the substrate 16 adjacent to two sides of the trench 56 and the substrate 16 directly under the trench 56 for forming another doped region 58. Structurally, the doped region 58 is substantially U-shaped and the doped region 58 is disposed in the substrate 16 directly under and adjacent to two sides of the trench 56 while overlapping part of the doped region 52 and part of undoped substrate 16. In this embodiment, the doped region 52 and the doped region 58 preferably include same conductive type such as both being n-type doped regions and the concentration of the doped region 58 is slightly lower than the concentration of the doped region 52.

Figure 11:
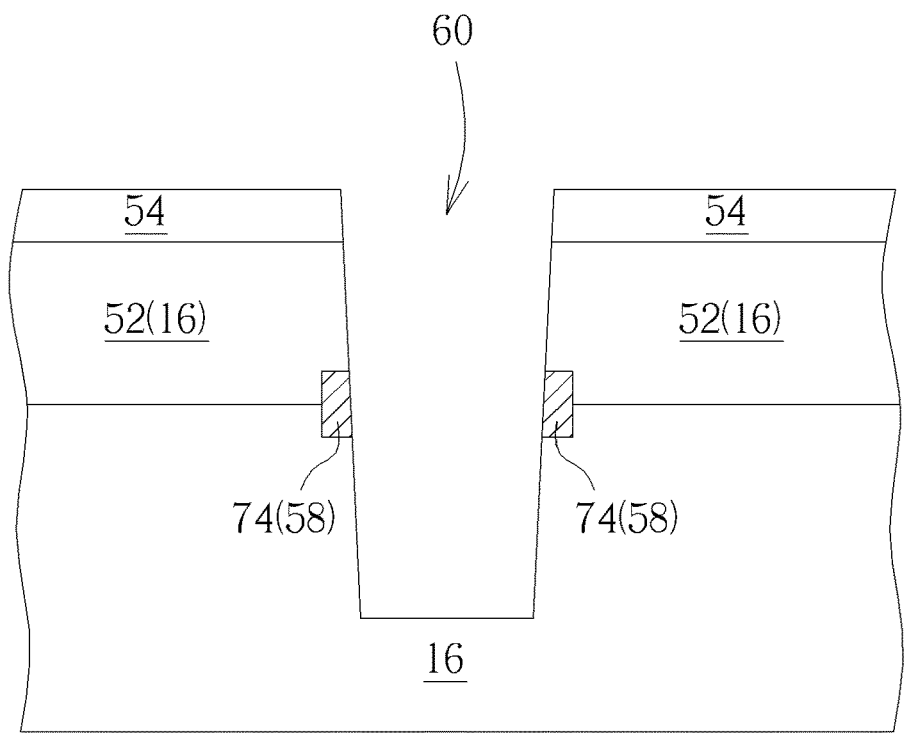

Next, as shown in FIG. 11, an etching process is conducted by using a patterned mask 54 as mask to extend the trench 56 further downward by removing part of the doped region 58 and part of the substrate 16 to form another trench 60. It should be noted that the patterned mask 54 may be slightly consumed during the etching process so that after the trench 60 is formed, the thickness of the patterned mask 54 could become slightly less than the thickness of the patterned mask 54 shown in FIG. 10. At this stage, the bottom of the trench 60 is preferably lower than the bottom surface of the doped region 52 and since the doped region 58 extending from the left side of the trench 56 to the right side of the trench 56 was separated in half as the trench 56 was extended downward, the remaining doped region 58 then becomes a barrier structure 74 made of two disconnected doped regions adjacent to two sides of the trench 60.

Figure 12:
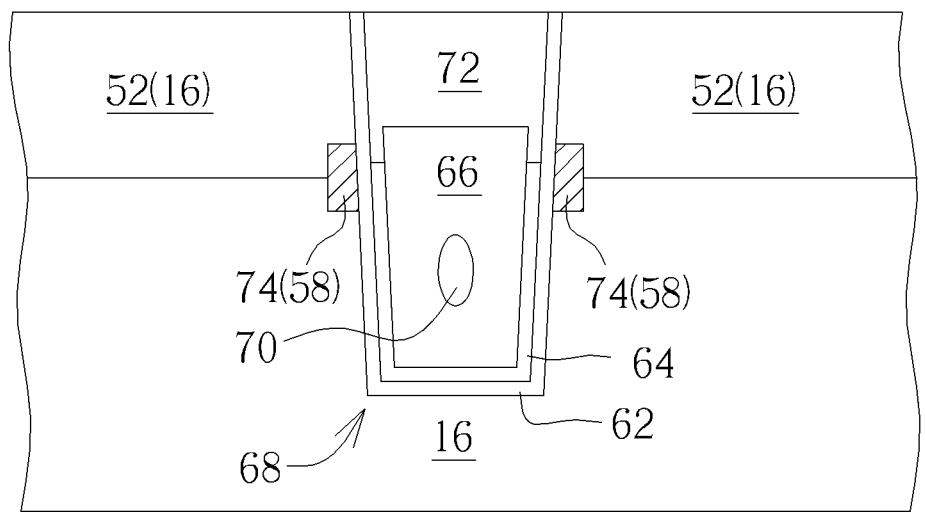

Next, as shown in FIG. 12, a gate dielectric layer 62, a barrier layer 64, and a conductive layer 66 are sequentially formed into the trench 60 to fill the trench 60 entirely, and an etching back process is conducted to remove part of the conductive layer 66 and part of the barrier layer 64 to form a gate structure 68 in the trench 60 and at the same time form an air gap 70 in the conductive layer 66. Preferably, the gate structure 68 is one of the word lines 14 shown in FIG. 1, the top surface of the barrier layer 64 is slightly lower than the top surfaces of the barrier structure 74 and conductive layer 66 but higher than the top surface of the doped region 52, and the top surface of the conductive layer 66 is also higher than the top surface of the barrier structure 74. Nevertheless, according to other embodiments of the present invention, the top surface of the barrier layer 64 could also be even with the top surface of the barrier structure 74, the top surface of the conductive layer 66 could be even with the top surface of barrier structure 64, or the top surfaces of the barrier layer 64, the conductive layer 66, and the barrier structure 74 are coplanar, which are all within the scope of the present invention.

Next, a hard mask 72 is formed on the gate structure 68, in which the top surface of the hard mask 72 is even with the top surface of the doped region 52. In this embodiment, the hard mask 72 is preferably made of dielectric material including but not limited to for example silicon nitride. Next, a contact plug process could be conducted to form bit line contacts adjacent to two sides of the gate structure 68 electrically connecting the source/drain region and bit lines formed thereafter and storage node contacts electrically connecting the doped region 52 and capacitors fabricated in the later process. This completes the fabrication of a buried word line according to an embodiment of the present invention.

In today's DRAM fabrication process, problem such as gate-induced-drain-leakage (GIDL) often arise when doped region such as lightly doped drain or source/drain region is too close to the gate structure. In order to resolve this issue, the present invention specifically forms a barrier structure between the gate structure (or buried word line) and the doped region, in which the barrier structure could be formed within the trench and made of same material as the second gate dielectric layer through the process shown in FIGS. 2-7, or could be formed outside the trench and made by ion implantation through the process shown in FIGS. 9-12. By using either of these two approaches the issue of GIDL could be reduced effectively and performance of the device could be improved substantially.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating a buried word line (BWL) of a dynamic random access memory (DRAM), comprising:
   forming a first doped region in a substrate;
   removing part of the first doped region to form a trench in the substrate;
   forming a gate structure in the trench; and
   forming a barrier structure between the gate structure and the first doped region, wherein a sidewall of the barrier structure is aligned with a sidewall of the gate structure.

2. The method of claim 1, further comprising:
   removing part of the first doped region and part of the substrate to form the trench;
   forming an organic layer in the trench;
   removing part of the organic layer;
   forming a first gate dielectric layer in the trench and on the organic layer;
   removing the organic layer;
   forming a second gate dielectric layer on the first gate dielectric layer and in the trench; and
   forming a conductive layer on the second gate dielectric layer to fill the trench.

3. The method of claim 2, further comprising forming the conductive layer on the second gate dielectric layer and forming an air gap in the conductive layer at the same time.

4. The method of claim 2, further comprising:
   forming a barrier layer on the second gate dielectric layer before forming the conductive layer;
   removing part of the conductive layer, part of the barrier layer, part of the second gate dielectric layer, and part of the first gate dielectric layer to form the barrier structure and the gate structure; and
   forming a hard mask on the gate structure.

5. The method of claim 1, wherein a top surface of the barrier structure is higher than a bottom surface of the first doped region and a bottom surface of the barrier structure is even with the bottom surface of the first doped region.

6. The method of claim 1, wherein a top surface of the barrier structure is higher than a bottom surface of the first doped region and a bottom surface of the barrier structure is lower than the bottom surface of the first doped region.

7. The method of claim 1, further comprising:
   conducting an ion implantation process to form a second doped region adjacent to two sides of the trench and in the substrate directly under the trench;
   removing part of the second doped region and part of the substrate to form the barrier structure adjacent to two sides of the trench; and
   forming the gate structure in the trench after forming the barrier structure.

8. The method of claim 7, wherein a concentration of the second doped region is less than a concentration of the first doped region.

9. The method of claim 7, wherein the first doped region and the second doped region comprise same conductive type.

10. A method for fabricating a buried word line (BWL) of a dynamic random access memory (DRAM), comprising:
    forming a first doped region in a substrate;
    removing part of the first doped region to form a trench in the substrate;
    forming a gate structure in the trench; and
    forming a barrier structure between the gate structure and the first doped region, wherein the barrier structure overlaps the first doped region and the substrate.

* * * * *